United States Patent [19]

Thillays

[11] 4,267,486
[45] May 12, 1981

[54] DEVICE FOR DISPLAYING ALPHANUMERICAL CHARACTERS

[75] Inventor: Jacques C. Thillays, Herouville St. Clair, France

[73] Assignee: U.S. Philips Corporation, New York, N.Y.

[21] Appl. No.: 51,489

[22] Filed: Jun. 25, 1979

Related U.S. Application Data

[63] Continuation of Ser. No. 870,246, Jan. 17, 1978, abandoned.

[30] Foreign Application Priority Data

Jan. 20, 1977 [FR] France ................................ 77 01566

[51] Int. Cl.³ ..................... H05B 33/02; H05B 33/20; H05B 33/22
[52] U.S. Cl. ..................................... 313/500; 313/512
[58] Field of Search ............... 313/499, 500, 512, 513; 260/42.25, 42.26, 42.27

[56] References Cited

U.S. PATENT DOCUMENTS

| | | | |
|---|---|---|---|
| 3,256,236 | 6/1966 | Herman et al. | 260/42.25 X |
| 3,609,475 | 9/1971 | Kaposhilin | 313/499 X |
| 3,711,733 | 1/1973 | Skutt | 313/518 |
| 3,772,249 | 11/1973 | Morgans | 260/42.27 X |
| 3,780,357 | 12/1973 | Haitz | 357/17 X |
| 3,840,769 | 10/1974 | Yamamoto et al. | 313/500 |
| 4,013,916 | 3/1977 | Brown | 313/499 X |
| 4,058,750 | 11/1977 | Schöberl | 313/500 |

Primary Examiner—Palmer C. Demeo
Attorney, Agent, or Firm—Thomas A. Briody; Robert T. Mayer; Paul R. Miller

[57] ABSTRACT

Display device for alphanumeric characters manufactured from a block having cavities at the bottom of which electroluminescent diodes are provided. The block is obtained from a plastic material and the cavities are filled with a transparent resin, said plastic material and said resin belonging to groups of materials which cannot adhere together.

13 Claims, 2 Drawing Figures

DEVICE FOR DISPLAYING ALPHANUMERICAL CHARACTERS

This is a continuation of application Ser. No. 870,246, filed Jan. 17, 1978, now abandoned.

The invention relates to a device for displaying alphanumerical characters and comprising a block of insulating material which is provided with cavities, at least one semiconductor electroluminescent diode being provided at the bottom of each cavity.

For displaying information or digital and alphanumerical data, devices are used which display the characters in a form composed of rectilinear luminescent elements. When the displayed characters should be observed from a distance and when several of the characters should be provided in the proximity of each other, there are used electroluminescent elements which are formed by diodes having semiconductor junctions. In the diode group thus used, each diode which is fixed on a suitable support forms a punctiform light source which is transformed into a rectangular image by known means.

In order to realize transformation, the most conventional method is probably that which is described in U.S. Pat. No. 3,780,357.

According to this United States Patent each diode constituting the punctiform light source is provided at the bottom of a cavity which is provided in a usually rectangular block of insulating material which is usually manufactured from a synthetic resin which, for reasons of reliability, should be capable of withstanding temperatures above 100° C.: this first condition usually restricts the choice to the polycarbonates, the polyamides, the polysulphones or the polyesters. In addition, however, in order to improve the reflection of the radiation on the wall of each cavity, the material of the block should be white while each aperture, whose shape should be approximately pyramidal, is filled with a diffusing epoxy resin which is usually colored and which has the property of strongly adhering to the white synthetic material of the block. Taking into account the different requirements, the choice of the synthetic resin for the block will be a polycarbonate to which much $TiO_2$ was added so as to give the polycarbonate a white color.

The method described in the aforementioned United States Patent has several disadvantages.

In fact, in order to ensure a good legibility of the information of the display device, a strong contrast should be realized between the surface of the device and the light sources. The block comprising the cavities is formed by a white polycarbonate having a large reflecting capacity, (even through a filter, if any), which results in the illuminated zones, being truly delimited with respect to the dark zones, namely the illuminated zones and the dark zones of the major surface into which the cavities debouch and on which the displayed character is written. For that purpose, it is necessary to cover the external surface of the major surface and usually the outer surface of the lateral walls of the block with at least a layer of preferably dull black paint.

This paint, however, the cost of which is high, poorly withstands mechanical and thermal influences and weather conditions, while in addition scratches can easily occur in the paint. Moreover, the paint poorly withstands the influence of chemical agents and in particular the influence of the solvents which are used in carrying out the method of manufacturing the display device. In these circumstances it is established that after a few manipulations or after a few hours in operation of the display device, the paint used has lost its initial aspects and has even disappeared entirely in certain places.

For the rest it is clear that the provision of the black paint requires special measures to avoid the paint from penetrating into the cavities, the walls of which must remain purely white so as to facilitate reflection of the radiation. Due to the automation difficulties of the method of providing paint it is necessary to repeat the provision of paint as many times as there are surfaces to be painted on each block.

In this manner it was established that the required presence of a layer of paint on a block has for its result that the cost of the block is tripled.

It is the object of the invention to remedy these disadvantages.

For that purpose, the invention is based on the chemical inert properties of certain plastics materials with respect to the types of resin usually used in electronic devices for the transfer of radiation.

For that purpose, according to the invention the device of the kind mentioned in the first paragraph has its cavities that are provided in the block, filled with a transparent resin, the resin and the insulating material of the block being chosen from two groups of materials which do not adhere together.

Since the transparent resin filling the cavities in the block does not adhere to the insulating material constituting the block, it is established that at the walls of said cavities an intermediate layer, or interface, is formed which fulfils the role of mirror which reflects light emitted by the electroluminescent diodes to the major surface of the display device.

It is advantageous that the insulating material from which the block is formed be impervious to the light emitted by the electroluminescent diodes. In this manner the function of light conductor of each cavity of the block is intensified and the path of the radiation is fully bounded by the walls of each cavity from the bottom of which the light is emitted.

In these circumstances it is also unnecessary to provide a layer of black paint on the outer surfaces of the block and thus all disadvantages are avoided to which the presence and the price of the layer of paint may cause. The transparent resin filling the cavities of the block preferably is a liquid epoxy resin of the cycloaliphatic type or of the diphenol type A which is selected for its properties of transparency and good dielectricity. In this case the material of the block is a thermoplastic material which is selected either from the group of ethylene polymers or polyolefins, or from the group of the polymers on the basis of fluorine or of polyfluoroethylene, the substances of the two groups having the property of adhering to none of the epoxy resins known so far to those skilled in the art.

In the group of the polyolefins the preferably selected thermoplastic materials are on the one hand the polypropylene polymer of the low pressure polyethylenes having as its formula

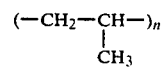

and on the other hand the polymer of methyl pentene of which the configuration of the elementary element is represented by the chain

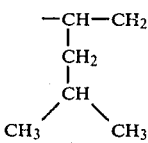

of which one of the most frequently used forms is commercially available as TPX.

As regards the group of the polyfluoroethenes, the thermoplastic material preferably selected is the polytetrafluoroethylene which is commercially known as Teflon.

The thermoplastic materials are mainly selected for their exceptional optical qualities but also for their behaviour at high temperatures. In fact it has been established that the choice of materials permits the manufacture of display devices which can operate at temperatures which are at least 20° higher than the temperatures which the devices obtained from polycarbonate can withstand. Otherwise, the thermoplastic materials polyolefins and/or polyfluoro ethenes are insensitive to the solvents and also to other chemical products which are used in the conventional methods of manufacturing display devices, while in addition the materials have a considerable hardness. In order to improve contrast, the thermoplastic material constituting the block may be coloured so as to obtain a dark tint. In addition, in order to protect the thermoplastic material against ultraviolet radiation, and avoid the slow degradation of the material, it is possible to cover the thermoplastic material with a layer of soot.

Finally it is possible by the choice of thermoplastic materials belonging to the groups of the polyolefins and the polyfluoroethenes to use in the cavities of the block epoxy resins which instead of an amine hardener comprise an anhydride hardener, which was impossible in the case in which the block was obtained from a polycarbonate, which is attached by the hardener.

It is known that it is possible by the use of an anhydride hardener instead of an amine hardener to avoid the progressive yellowing of the resin which occurs under the combined influence of the temperature and the ambient oxygen atmosphere.

The invention will now be described in greater detail with reference to a drawing in which.

It is to be noted that, for clarity, the dimensions in the Figures are considerably exaggerated and are not drawn to the same scale.

Figure 1:
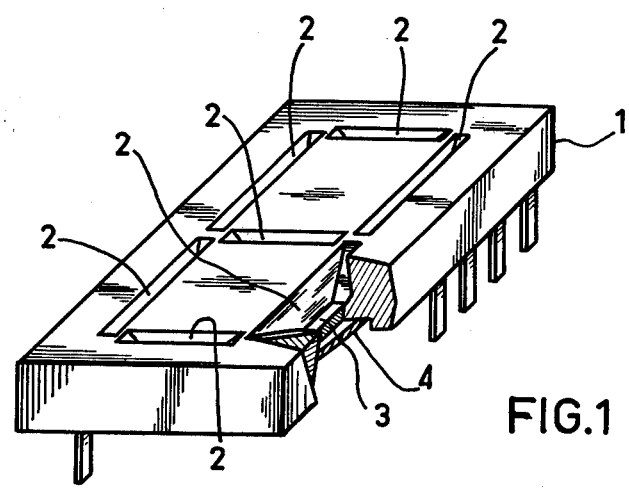
FIG. 1 is a perspective view of a display device according to the invention.

The display device shown in FIG. 1 comprises a block 1 of black thermoplastic material, for example, a polymer of methyl pentene of the TPX-type to which soot was added. Substantially pyramidal cavities 2 are provided in the block. In the most conventional form of the display devices, the devices comprise seven cavities 2 that are arranged in such manner as to form two adjacent squares which form the figure eight.

The electroluminescent diodes 3 consisting of semiconductor crystals are provided on the lower part of the cavities 2 and are secured to a metal support or comb 4.

Figure 2:
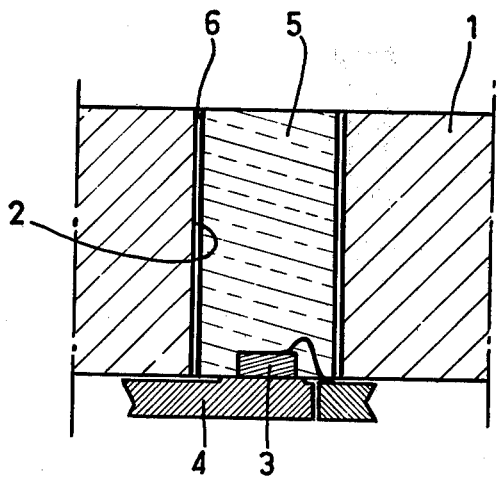
FIG. 2 is a diagrammatic sectional view on an enlarged scale of a cavity of the display device according to the invention.

As shown in FIG. 2, the cavities 2 are filled with a transparent epoxy resin 5. As a resin there can be used, for example, a resin of the cycloaliphatic type to which a suitable hardener has been added and possibly a powder which diffuses the light, and a dye.

The thermoplastic material constituting the block 1 and the epoxy resin 5 have the property of not adhering together. In these circumstances, an interface 6 which reflects the light emitted by the diode 3 is formed between the walls of the cavity 2 and the epoxy resin 5.

It is the formation of such a "mirror" which permits replacing the white walls of the cavities by black walls which are manufactured from a material whose cost is much lower.

What is claimed is:

1. A device for displaying alphanumerical characters comprising a block of insulating material having a plurality of cavities extending into said block, at least one semiconductor electroluminescent diode being provided at each cavity, and a transparent resin filling said cavities and contacting the walls of said cavities over the entire extent of said cavities in said block, said transparent resin and said insulating material of said block being formed of respective different substances which do not adhere together for forming a reflecting interface between said cavity walls and said resin along said entire extent.

2. A device as in claim 1, wherein said insulating material from which said block is formed is impervious to light emitted by said electroluminescent diodes.

3. A device as in claim 1, wherein said transparent resin is an epoxy resin.

4. A device as in claim 3, wherein said epoxy resin is of the cycloaliphatic type.

5. A device as in claim 3, wherein said epoxy resin is of the bisphenol A type.

6. A device as in claim 1, wherein said block is formed from a thermoplastic material selected from the group, consisting essentially of polyolefins.

7. A device as in claim 6, wherein said thermoplastic material is polypropylene.

8. A device as in claim 6, wherein said thermoplastic material is a polymer of methyl pentene.

9. A device as in claim 1, wherein said block is formed from a thermoplastic material selected from the group consisting essentially of polyfluoroethenes.

10. A device as in claim 9, wherein said thermoplastic material is polytetrafluoroethylene.

11. A device as in claim 1, wherein a quantity of soot is added to said insulating material from which said block is formed.

12. A device as in claim 1, wherein said block is of a dark color.

13. A device as in claim 12, wherein said block has black cavity walls.

* * * * *